United States Patent
Ahn

(10) Patent No.: US 10,439,168 B2
(45) Date of Patent: Oct. 8, 2019

(54) APPARATUS FOR MANUFACTURING DISPLAY DEVICE AND METHOD OF MANUFACTURING DISPLAY DEVICE USING THE SAME

(71) Applicant: SAMSUNG DISPLAY CO., LTD., Yongin, Gyeonggi-Do (KR)

(72) Inventor: Kyunghyun Ahn, Yongin (KR)

(73) Assignee: SAMSUNG DISPLAY CO., LTD., Yongin, Gyeonggi-do (KR)

( * ) Notice: Subject to any disclaimer, the term of this patent is extended or adjusted under 35 U.S.C. 154(b) by 402 days.

(21) Appl. No.: 14/726,950

(22) Filed: Jun. 1, 2015

(65) Prior Publication Data

US 2016/0088779 A1   Mar. 24, 2016

(30) Foreign Application Priority Data

Sep. 24, 2014 (KR) .......................... 10-2014-0127875

(51) Int. Cl.
*H01L 21/67* (2006.01)
*G02F 1/13* (2006.01)
(Continued)

(52) U.S. Cl.
CPC ............ *H01L 51/56* (2013.01); *G02F 1/1303* (2013.01); *H01L 21/67092* (2013.01);
(Continued)

(58) Field of Classification Search
CPC ... H01L 51/56; H01L 21/67092; H01L 21/68; H01L 51/5256; G02F 1/1303; G02F 2001/133325
(Continued)

(56) References Cited

U.S. PATENT DOCUMENTS

2001/0053648 A1* 12/2001 Furukawa ............... B32B 17/06
445/24
2002/0055210 A1* 5/2002 Peng .................. H01L 27/3281
438/160
(Continued)

FOREIGN PATENT DOCUMENTS

CN   1319826 A   10/2001
CN   102651457 A   8/2012
(Continued)

OTHER PUBLICATIONS

KR 101349329, Sealing System and Method of Organic Light Emitting Diode, Kang Jin Koo (Year: 2011).*
(Continued)

*Primary Examiner* — Michael N Orlando
*Assistant Examiner* — Christian Roldan
(74) *Attorney, Agent, or Firm* — Lee & Morse, P.C.

(57) ABSTRACT

An apparatus for manufacturing a display device, the apparatus including a chamber; a first holder in which a first member is to be mounted, the first holder being in the chamber; a pre-alignment unit in which a second member is to be mounted; a second holder that receives the pre-alignment unit, the second holder being positioned in the chamber opposite the first holder such that the second holders move linearly with respect to each other along a first direction; and a pin unit to bring a portion of the second member of the pre-alignment unit into contact with the first member by extending in the first direction, the pin unit being in the chamber.

6 Claims, 7 Drawing Sheets

(51) Int. Cl.
*H01L 51/52* (2006.01)
*G02F 1/1333* (2006.01)
*H01L 51/56* (2006.01)
*H01L 21/68* (2006.01)

(52) U.S. Cl.
CPC .. *H01L 21/68* (2013.01); *G02F 2001/133325* (2013.01); *H01L 51/5256* (2013.01)

(58) Field of Classification Search
USPC .......................................................... 156/285
See application file for complete search history.

(56) References Cited

U.S. PATENT DOCUMENTS

2007/0190674 A1* 8/2007 Lee .................................. 438/21
2009/0124158 A1 5/2009 Hwang
2012/0318771 A1* 12/2012 Guo ...................... G02F 1/1303
216/20

FOREIGN PATENT DOCUMENTS

| KR | 10-2006-0016972 A | 2/2006 |
| KR | 10-2011-0111535 A | 10/2011 |
| KR | 10-2012-0068341 A | 6/2012 |
| KR | 10-2012-0083686 A | 7/2012 |
| KR | 10-2013-0011295 A | 1/2013 |
| KR | 10-2013-0057365 A | 5/2013 |
| TW | 200927491 A | 7/2009 |
| WO | WO 2010-090223 A1 | 8/2010 |

OTHER PUBLICATIONS

Office Action dated Jan. 7, 2019 of the Chinese Patent Application No. 201510612233.1.
Office Action issued by the Taiwanese Patent Office dated Jun. 2019 in the examination of the Taiwanese Patent Application No. 104129807.

* cited by examiner

APPARATUS FOR MANUFACTURING DISPLAY DEVICE AND METHOD OF MANUFACTURING DISPLAY DEVICE USING THE SAME

CROSS-REFERENCE TO RELATED APPLICATION

Korean Patent Application No. 10-2014-0127875, filed on Sep. 24, 2014, in the Korean Intellectual Property Office, and entitled: "Apparatus for Manufacturing Display Device and Method of Manufacturing Display Device Using the Same," is incorporated by reference herein in its entirety.

BACKGROUND

1. Field

One or more exemplary embodiments relate to an apparatus for manufacturing a display device and a method of manufacturing the display device.

2. Description of the Related Art

Mobile electronic apparatuses include tablet personal computers (PCs) and small electronic devices such as mobile phones.

SUMMARY

Embodiments may be realized by providing an apparatus for manufacturing a display device, the apparatus including a chamber; a first holder in which a first member is to be mounted, the first holder being in the chamber; a pre-alignment unit in which a second member is to be mounted; a second holder that receives the pre-alignment unit, the second holder being positioned in the chamber opposite the first holder such that the second holders move linearly with respect to each other along a first direction; and a pin unit to bring a portion of the second member of the pre-alignment unit into contact with the first member by extending in the first direction, the pin unit being in the chamber.

The pre-alignment unit may include a body portion; and at least one second member mounting groove which is concave with respect to a surface of the body portion.

The second member mounting groove may include an insertion hole into which a portion of the pin unit is inserted.

The apparatus may further include an alignment unit to vary a position of the second holder and in which the second holder is mounted.

The apparatus may further include a filming unit which captures images of a position of the pre-alignment unit and a position of the first member.

The apparatus may further include a first linear driving unit connected to the second holder, the first linear driving unit to move the second holder linearly along the first direction.

The pin unit may include a head portion contacting the second member such that a contact area is a dot or a line; and a second linear driving unit connected to the head portion and moving the head portion linearly along the first direction At least a portion of the head portion may include an insulating material.

The apparatus may further include a pressure adjusting unit connected to the chamber and adjusting an inner pressure of the chamber.

The pressure adjusting unit may include a connection pipe connected to the chamber; and a pump in the connection pipe, the pump to discharge a gas from the connection pipe to the outside or supply external gas to the connection pipe.

The apparatus may further include an attaching roller unit laminating the second member onto the first member.

The attaching roller unit may include a roller rolling across a surface of the second member; and a third linear driving unit connected to the roller and moving the roller linearly in a direction orthogonal to the first direction. At least one portion of the second member may be in contact with the first member The attaching roller unit may further include a force applying unit between the third linear driving unit and the roller and applying force to the roller toward the first member.

The apparatus may further include a pressing unit in the chamber and attaching the second member to the first member by applying force to the second member.

The pressing unit may be at the first holder and may be rotatable.

A surface of the pre-alignment unit may be insulated.

Embodiments may be realized by providing a method of manufacturing a display device, the method including inserting a second member into at least one second member mounting groove in a pre-alignment unit and mounting the second member in the at least one second member mounting groove; moving the pre-alignment unit linearly in a first direction such that the pre-alignment unit comes into contact with a first member mounted in a first holder in a chamber; attaching a portion of the second member to the first member by activating a pin unit which brings the second member into contact with the first member such that a contact area is a dot or a line; and attaching an entire surface of the first member and an entire surface of the second member to each other.

Attaching the portion of the second member may include moving the pre-alignment unit linearly in the first direction such that the pre-alignment unit is away from the first member.

Attaching the entire surface of the first member and the entire surface of the second member to each other may include adjusting internal pressure of the chamber from a vacuum state to atmospheric pressure.

Attaching the entire surface of the first member and the entire surface of the second member to each other may include rolling a roller across the second member.

Attaching the entire surface of the first member and the entire surface of the second member to each other may include applying pressure to the second member.

The method may further include aligning the pre-alignment unit and the first member in a direction orthogonal to the first direction before moving the pre-alignment unit linearly along the first direction.

Attaching the portion of the second member to the first member and attaching the entire surface of the first member to the entire surface of the second member may be performed in a vacuum state.

BRIEF DESCRIPTION OF THE DRAWINGS

Features will become apparent to those of skill in the art by describing in detail exemplary embodiments with reference to the attached drawings in which.

DETAILED DESCRIPTION

Figure 1:
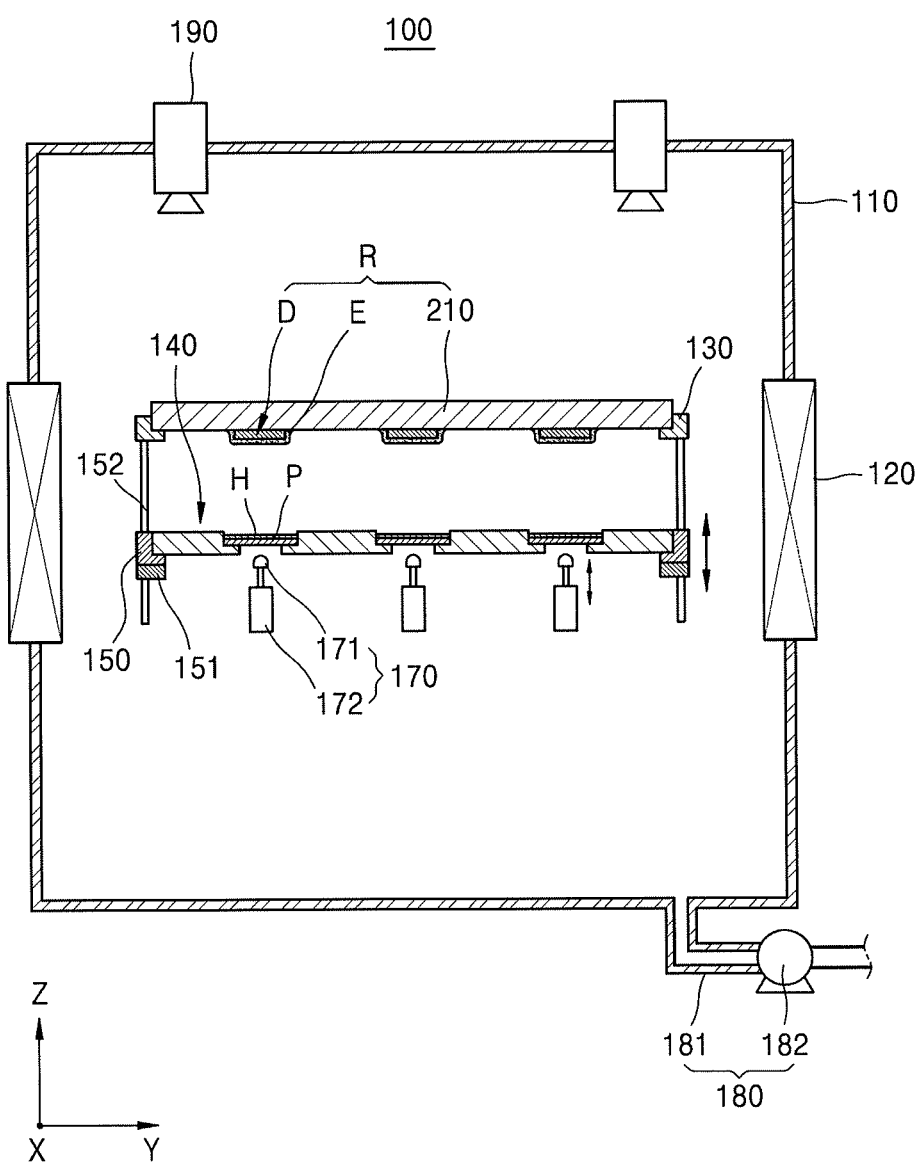
FIG. 1 illustrates a cross-sectional view of an apparatus for manufacturing a display device, according to an embodiment.

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey exemplary implementations to those skilled in the art.

Like reference numerals in the drawings denote like elements, and repeated descriptions thereof will be omitted.

As used herein, the term "and/or" includes any and all combinations of one or more of the associated listed items. Expressions such as "at least one of," when preceding a list of elements, modify the entire list of elements and do not modify the individual elements of the list.

While such terms as "first" and "second" may be used to describe various components, such components must not be limited to the above terms. The above terms are used only to distinguish one component from another.

As used herein, the singular forms "a," "an," and "the" are intended to include the plural forms as well, unless the context clearly indicates otherwise.

It will be further understood that the terms such as "including," "comprising," and "having" used herein specify the presence of stated features or components, but do not preclude the presence or addition of one or more other features or components.

It will be understood that when a layer, region, or component is referred to as being "formed on" another layer, region, or component, it can be directly or indirectly formed on the other layer, region, or component. That is, for example, intervening layers, regions, or components may be present. Further, it will be understood that when a layer is referred to as being "under" another layer, it can be directly under, and one or more intervening layers may also be present. In addition, it will also be understood that when a layer is referred to as being "between" two layers, it can be the only layer between the two layers, or one or more intervening layers may also be present.

Sizes of components in the drawings may be exaggerated for convenience of explanation. In other words, since sizes and thicknesses of components in the drawings are arbitrarily illustrated for convenience of explanation, the following embodiments are not limited thereto.

In the following examples, the x-axis, the y-axis and the z-axis are not limited to three axes of the rectangular coordinate system, and may be interpreted in a broader sense. For example, the x-axis, the y-axis, and the z-axis may be perpendicular to one another, or may represent different directions that are not perpendicular to one another.

When an embodiment may be implemented differently, a specific process order may be performed differently from the described order. For example, two consecutively described processes may be performed substantially at the same time or performed in an order opposite to the described order.

Figure 2:
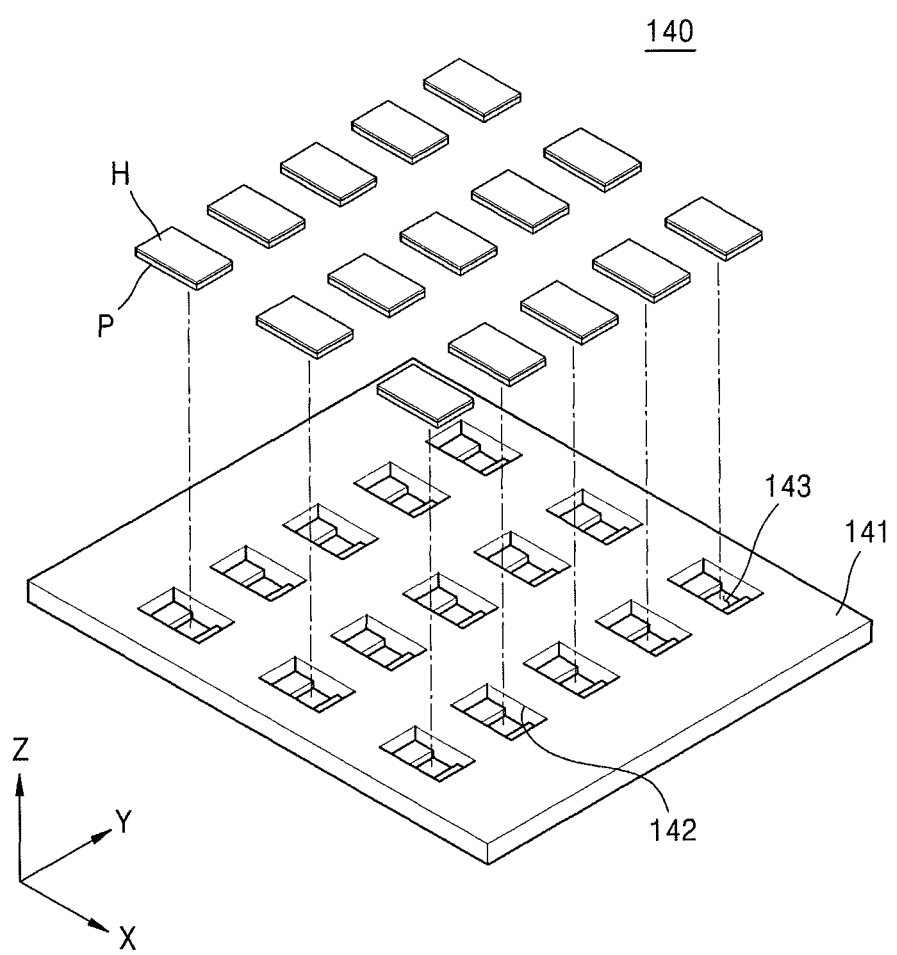
FIG. 2 illustrates a perspective view of a pre-alignment unit of FIG. 1.

FIG. 1 illustrates a cross-sectional view of an apparatus 100 for manufacturing a display device, according to an embodiment. FIG. 2 illustrates a perspective view of a pre-alignment unit 140 of FIG. 1. Referring to FIGS. 1 and 2, the apparatus 100 may include a chamber 110, a first holder 130, the pre-alignment unit 140, a second holder 150, a first linear driving unit 152, a pin unit 170, an alignment unit 151, a filming unit 190, and a pressure adjusting unit 180.

A space may be formed in the chamber 110. The chamber 110 may have an opening formed therein. A gate valve 120 may be provided in the opening of the chamber 110 to open and close the opening.

The first holder 130 may be fixed to the inside of the chamber 110. The first holder 130 may be in a form of a bracket such that a first member R may be mounted in the first holder 130 or in a form of a clamp such that the position of the first member R may be fixed to the first holder 130. Hereinafter, the case in which the first holder 130 is provided in the form of a bracket will be mainly described in detail for convenience of explanation.

The pre-alignment unit 140 may be formed of various materials. For example, the pre-alignment unit 140 may be formed of an insulating material such as plastic or silicon. The pre-alignment unit 140 may be formed of a metal material such as aluminum or stainless steel. A surface of the pre-alignment unit 140 may be coated with an insulating layer. For example, the pre-alignment unit 140 may be formed of the metal material, and the surface of the pre-alignment unit 140 may be anodized, or may be covered by or coated with an insulating material such as plastic or rubber. When a second member P is mounted in the pre-alignment unit 140 or the pre-alignment unit 140 comes into contact with the first member R, the pre-alignment unit 140 may prevent at least one of the first member R and the second member P from being damaged due to static electricity.

The pre-alignment unit 140 may include a body portion 141 and a second member mounting groove 142 in the body portion 141. The second member mounting groove 142 is to mount along the z-axis the second member P including an adhesive member H.

The second member mounting groove 142 may be concave with respect to a surface of the body portion 141, and pre-aligning of the second member P may not be performed separately after the second member P is mounted in the second member mounting groove 142. An insertion hole 143, through which a portion of the pin unit 170 passes, may be formed in the second member mounting groove 142. An area of the second member mounting groove 142 may be greater than that of the insertion hole 143 in the x-y plane.

At least one second member mounting groove 142 may be formed in the surface of the body portion 141. The second member mounting groove 142 may be provided in plurality, and the plurality of second member mounting grooves 142 may be spaced apart from each other, e.g., in a matrix or the x-y plane.

The second holder 150 may fix the pre-alignment unit 140. Similar to the first holder 130, the second holder 150 may be in the form of a bracket or in the form of a clamp. The second holder 150 may linearly move inside the chamber 110. For example, as shown in FIG. 1, the second holder 150 may linearly move in a vertical direction, e.g., z-direction, of the chamber 110.

The first linear driving unit 152 may move the second holder 150 linearly. The first linear driving unit 152 may include a linear motor. In some embodiments, the first linear driving unit 152 may include a motor, gears, and rack gears engaged with the gears. In other embodiments, the first linear driving unit 152 may include a cylinder with varying length. Hereinafter, the case in which the first linear driving unit 152 is the linear motor will be mainly described in detail for convenience of explanation.

After the pin unit 170 extends and brings the second member P into contact with the first member R such that the contact area is a dot or a line, the pin unit 170 may bond a portion of the second member P to the first member R. The pin unit 170 may include a head portion 171 which comes into contact with the second member P such that the contact area is a dot or a line, and a second linear driving unit 172 connected to the head portion 171 to move the head portion 171 linearly, e.g., along the z-direction.

The head portion 171 may be variously formed. For example, the head portion 171 may have a shape of a hemisphere such that the head portion 171 comes into contact with the second member P and the contact area is a dot. In some embodiments, the head portion 171 may have a shape of a column having a semi-circular cross-section such that the head portion 171 comes into contact with the second member P and the contact area is a line. In an embodiment, the contact area between the head portion 171 and the second member P may be a dot or a line.

The head portion 171 may be formed of an insulating material, or a surface thereof may be coated with the insulating material. For example, the head portion 171 may be formed of an insulating material such as plastic, silicon, or ceramic. In some embodiments, the head portion 171 may be formed of a metal material, and the surface of the head portion 171 may have at least one portion including the insulating material or anodized. For example, a portion of the head portion 171 that comes into contact with the second member P may be coated with an insulating material. Hereinafter, the case in which the head portion 171 is formed of the insulating material will be mainly described in detail for convenience of explanation.

The second linear driving unit 172 may be similar to the first linear driving unit 152. Examples of the second linear driving unit 172 may include a motor, gears, and rack gears, and the head portion 171 may be connected to the rack gears and may move linearly. In some embodiments, the second linear driving unit 172 may be a cylinder connected to the head portion 171. Hereinafter, the case in which the second linear driving unit 172 is the cylinder will be mainly described in detail for convenience of explanation.

The alignment unit 151 may be connected to the second holder 150 in which the pre-alignment unit 140 is mounted. The alignment unit 151 may move the second holder 150 in three different directions. The alignment unit 151 may be identical or similar to an alignment unit used in the field of displays, and a detailed description thereof will be omitted.

The filming unit 190 may be provided in the chamber 110 to capture images of positions of the pre-alignment unit 140 and the first member R. The filming unit 190 may capture images of shapes of the pre-alignment unit 140 and the first member R. The pre-alignment unit 140 and the first member R respectively may have alignment marks, and the filming unit 190 may also capture images of each of the alignment marks of the pre-alignment unit 140 and the first member R.

The pressure adjusting unit 180 may include a connection pipe 181 connected to the chamber 110, and a pump 182 to discharge gas from the connection pipe 181 to the outside or supply external gas to the connection pipe 181.

The apparatus 100 may include a controller (not shown) which controls each component of the apparatus 100. The controller may be a circuit board that is to be provided in the chamber 110 or a terminal, e.g., a computer or cell phone connected to the outside over wires or wirelessly.

Hereinafter, a method of manufacturing a display device (not denoted) by using the apparatus 100 for manufacturing a display device will be described in detail.

Figure 3A:
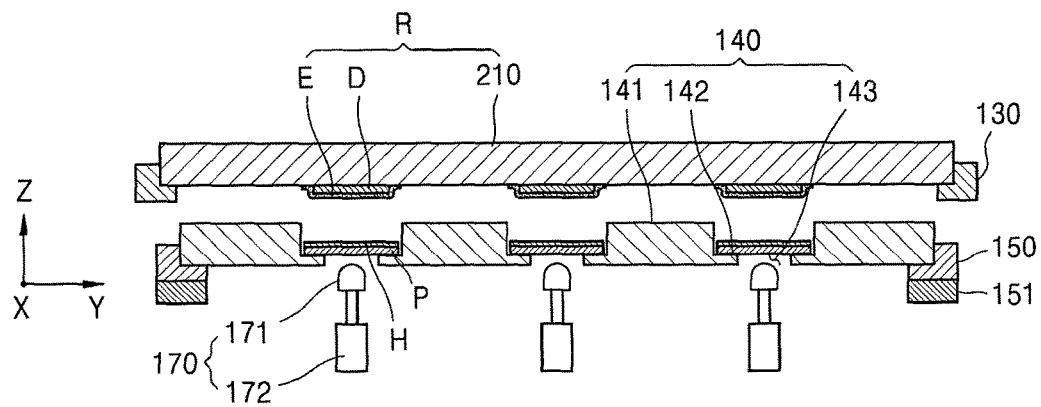
FIGS. 3A through 3F illustrate a process of manufacturing a display device by using the apparatus for manufacturing a display device of FIG. 1.

FIGS. 3A through 3F illustrate a process of manufacturing a display device by using the apparatus 100 for manufacturing a display device of FIG. 1. FIG. 4 illustrates a cross-sectional view of the display device manufactured by using the apparatus 100 for manufacturing a display device of FIG. 1. Referring to FIGS. 3A through 4, the first member R and the second member P may be manufactured. The first member R and the second member P may vary. For example, each of the first member R or the second member P may include a display device 200, a cover window, a touch panel, a substrate 210, and additional films, e.g., a protection film, an optical film, or a polarizing film. Hereinafter, the case in which the first member R is the display device 200 and the second member P is the polarizing film will be mainly described in detail for convenience of explanation.

The display device 200 may be in various forms. For example, the display device 200 may include a liquid crystal display panel, a plasma display panel, or an organic light-emitting display panel. Hereinafter, the case in which the display device 200 includes the organic light-emitting display panel will be mainly described in detail for convenience of explanation.

In the case after the first member R and the second member P are prepared, the adhesive member H may have been formed in the second member P. The adhesive member H may be an adhesive, or an optically clear adhesive film (OCA).

Next, the second member P may be mounted in the second member mounting groove 142 formed in the pre-alignment unit 140. The second member P in plurality may be respectively mounted in the second member mounting groove 142 in plurality. In the above case in which the plurality of second members P are respectively mounted in the plurality of second member mounting grooves 142, pre-aligning the second member P may not be separately performed.

In order to attach the second member P to the first member R, pre-aligning the second member P may be separately performed and then precisely aligning the first member R and the second member P may be performed. The pre-aligning process may be performed by mounting the second member P to an extra stage and then moving the second member P in one direction such that corners of the second member P come into contact with, for example, a block.

According to the exemplary embodiments, the pre-aligning process may be completed by inserting the second member P into the second member mounting groove 142 of the pre-alignment unit 140. According to the apparatus 100 for manufacturing a display device and a method of manufacturing a display device, the second member P may be pre-aligned via a simple structure, and space needed for manufacturing the display device and manufacturing time may be reduced.

Once the arrangement of the second member P is complete, the pre-alignment unit 140 may be inserted into the chamber 110, for example, by a robot arm. The pressure adjusting unit 180 may adjust the internal pressure of the chamber 110 to be equal to atmospheric pressure, and the gate valve 120 may open or close the opening of the chamber 110.

Before or while the pre-alignment unit 140 of the second member P is inserted into the chamber 110, the first member R may also be inserted into the chamber 110. A method of inserting the first member R into the chamber 110 may be identical or similar to that of inserting the second member P into the chamber 110, and a detailed description thereof will be omitted.

When the first member R and the second member P enter the chamber 110, the first member R and the second member P may be respectively mounted in the first holder 130 and the second holder 150. The pump 182 may be activated thereafter to discharge gas from the connection pipe 181 to the outside, and a vacuum state may be maintained inside the chamber 110.

The filming unit 190 may capture images indicating the positions of the first member R and the pre-alignment unit 140, and transmit the captured images to the controller. The controller may compare predetermined positions of the first member R and the pre-alignment unit 140 and the positions of the first member R and the pre-alignment unit 140 based on the transmitted images and may determine if the first member R and the pre-alignment unit 140 are aligned, e.g., along the x-y plane.

If the controller determines the positions of the first member R and the pre-alignment unit 140 are misaligned, the alignment unit 151 may be controlled to adjust the position of the pre-alignment unit 140. If the positions of the first member R and the pre-alignment unit 140 are determined to be aligned, the controller may proceed with a subsequent process (Refer to FIG. 3A).

Figure 3B:
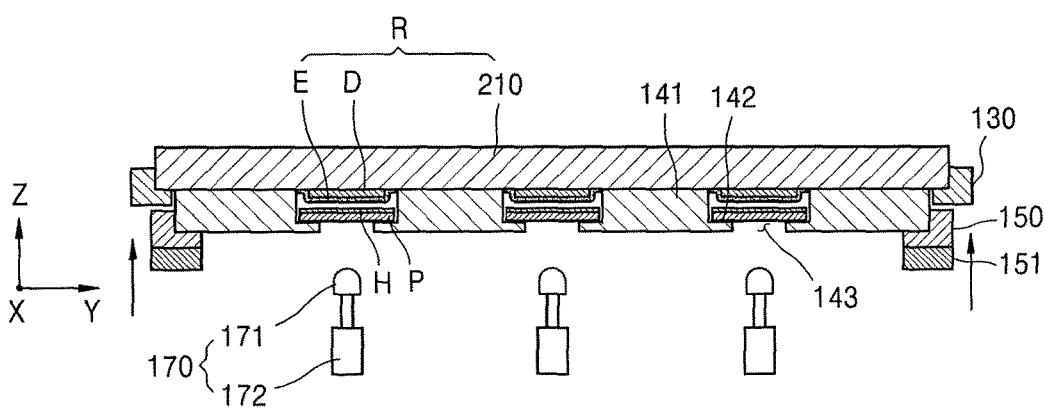
Figure 3C:
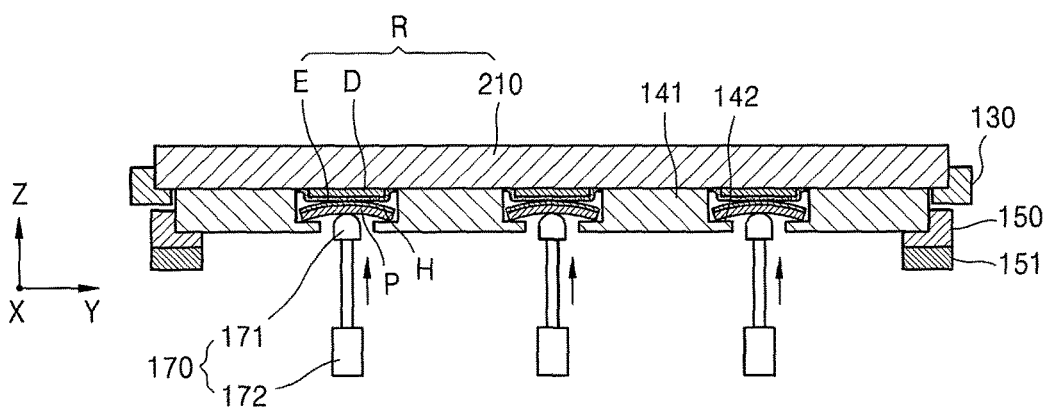
Figure 4:
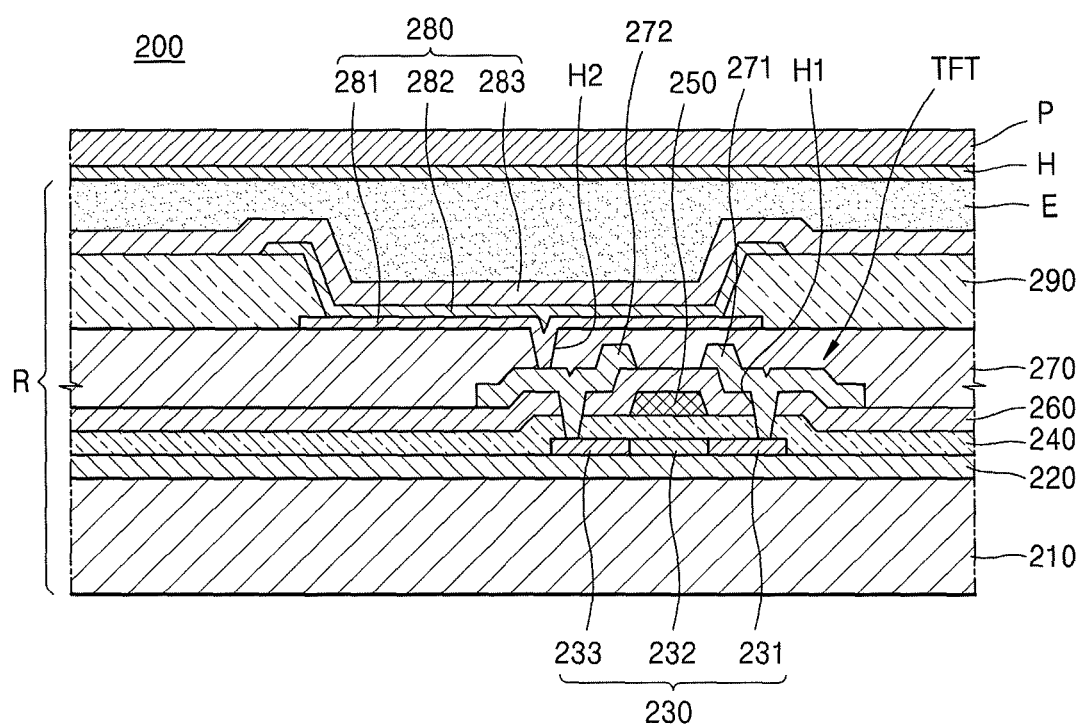
FIG. 4 illustrates a cross-sectional view of the display device manufactured by using the apparatus for manufacturing a display device of FIG. 1.

When the aligning of the positions of the first member R and the pre-alignment unit 140 is completed, the first linear driving unit 152 may be activated to move the second holder 150 linearly, e.g., along the z-direction, such that the pre-alignment unit 140 is adjacent to the first member R (Refer to FIG. 3B).

Next, the second linear driving unit 172 may be activated to raise the head portion 171, e.g., along the z-direction, and as the head portion 171 passes through the insertion hole 143, the head portion 171 may make contact with the second member P such that the contact area is a dot or a line, and force may be applied thereto. Only certain regions of the second member P and the first member R may adhere to each other due to the adhesive member H (Refer to FIG. 3C).

Figure 3D:
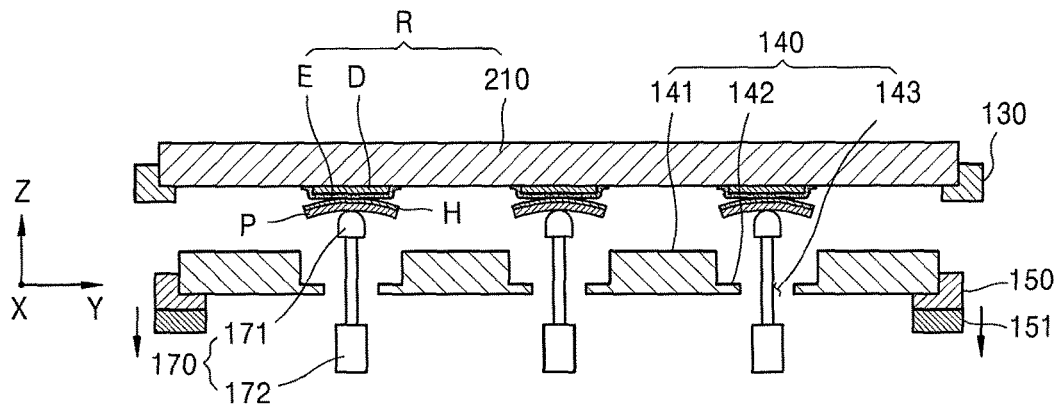
Figure 3E:
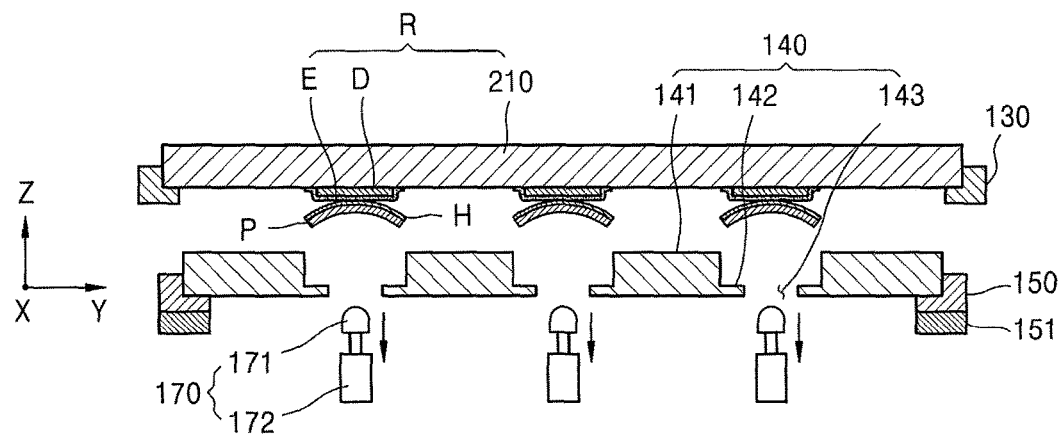
Figure 3F:
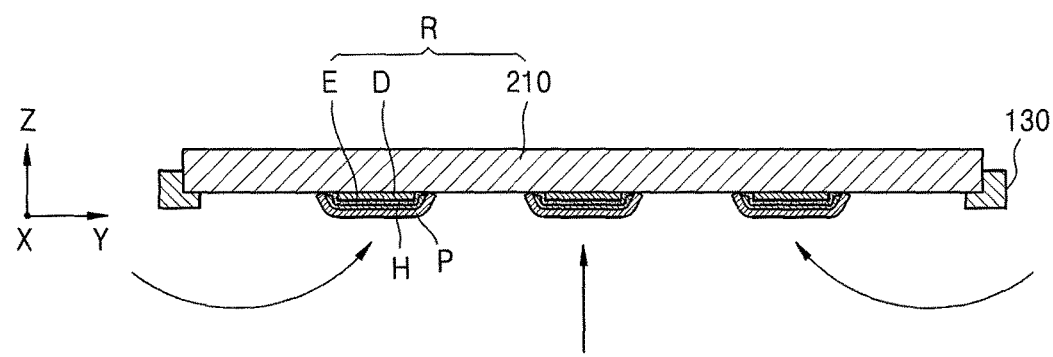

During the above process, the first linear driving unit 152 may be activated to move the pre-alignment unit 140 linearly, e.g., along the z-direction, such that the pre-alignment unit 140 is separated from the first member R, e.g., along the z-direction (Refer to FIG. 3D). The second linear driving unit 172 may be activated thereafter to move the head portion 171, e.g., along the z-direction, away from the second member P (Refer to FIG. 3E).

Once the above process is complete, the pump 182 may be activated to supply external gas into the chamber 110 through the connection pipe 181. There may be a difference in pressure between different regions inside of the chamber 110. For example, a relatively high pressure is formed around a region of the chamber 110 which is adjacent to the connection pipe 181, and a relatively low pressure is formed around the first member R and the second member P. Pressure may be applied to the second member P toward the first member R due to the pressure difference as described above, and the first member R and the second member P may be attached. The first member R and the second member P may be attached to each other instantaneously. By maintaining the vacuum state between the first member R and the second member P, the first member R and the second member P may be attached to each other with accuracy, and the formation of bubbles therebetween may be prevented.

According to the apparatus 100 for manufacturing a display device and the method of manufacturing a display device, the first member R and the second member P may be attached without bubbles, and defects in the display device may be reduced.

According to the apparatus 100 for manufacturing a display device and the method of manufacturing a display device, the second member P may be simply pre-aligned, an operation line length may be reduced, and manufacturing time may be shortened.

The display device manufactured by the above method may include the first member R, the second member P, and the adhesive member H. The first member R may include the substrate 210 and a display unit D. The first member R may also include a thin film encapsulation layer E formed on the top of the display unit D or an encapsulation substrate (not shown). The encapsulation substrate (not shown) may be identical or similar to an encapsulation substrate used in a display device, and a detailed description thereof will be omitted. Hereinafter, the case in which the first member R includes the thin film encapsulation layer E will be mainly described in detail for convenience of explanation.

The display unit D may be formed on the substrate 210. A thin film transistor (TFT) may be included in the display unit D, a passivation layer 270 may be formed to cover the TFT and the display unit D, and an organic light-emitting device (OLED) 280 may be formed on the passivation layer 270.

In an embodiment, the substrate 210 may be formed of glass. The substrate 210 may also be formed of a plastic material, polyimide (PI), or a metal material such as SUS or titanium (Ti). Hereinafter, the case in which the substrate 210 is formed of glass will be mainly described in detail for convenience of explanation.

On an upper surface of the substrate 210, a buffer layer 220 including an organic compound and/or an inorganic compound is further formed. The buffer layer 220 may be formed of silicon oxide ($SiO_x$, $x \geq 1$) and/or silicon nitride ($SiN_x$, $x \geq 1$).

An active layer 230 arranged in a predetermined pattern may be formed on the buffer layer 220, and at least of the active layer 230 may be covered by a gate insulating layer 240. The active layer 230 may have a source region 231 and a drain region 233, and may further include a channel region 232 between the source region 231 and the drain region 233.

The active layer 230 may be formed to include various materials. For example, the active layer 230 may contain an inorganic semiconductor material such as amorphous silicon or crystalline silicon. In an embodiment, the active layer 230 may contain an oxide semiconductor. In some embodiments, the active layer 230 may contain an organic semiconductor material. Hereinafter, the case in which the active layer 230 is formed of amorphous silicon will be mainly described in detail for convenience of explanation.

The active layer 230 may be formed by forming an amorphous silicon film on the buffer layer 220, crystallizing the amorphous silicon film into a polycrystalline silicon film, and then patterning the polycrystalline silicon film. The source region 231 and the drain region 233 included in the active layer 230 may be doped with impurities based on the type of TFT. For example, the TFT may be a driving TFT (not shown) or a switching TFT (not shown).

On an upper surface of the gate insulating layer 240, a gate electrode 250 corresponding to the active layer 230 and an interlayer insulating layer 260 covering the gate electrode 250 may be formed.

A contact hole H1 may be formed in the interlayer insulating layer 260 and the gate insulating layer 240, and a source electrode 271 and a drain electrode 272 may be formed on the interlayer insulating layer 260 to be in contact with the source region 231 and the drain region 233, respectively.

On the top of the TFT, the passivation layer 270 may be formed. On the top of the passivation layer 270, a pixel electrode 281 of the OLED 280 may be formed. The pixel electrode 281 may contact the drain electrode 272 of the TFT through a via hole H2 formed in the passivation layer 270. The passivation layer 270 may be formed of an inorganic material and/or an organic material as a single layer or multiple layers. When the passivation layer 270 is formed of multiple layers, an uppermost layer from among the multiple layers may be a planarization layer that may planarize an upper surface of the passivation layer 270 such that the upper surface of the passivation layer 270 is planar regardless of unevenness in a lower layer of the passivation layer 270. In an embodiment, the passivation layer 270 may be formed such that the upper surface of the passivation layer 270 is uneven corresponding to the unevenness in the lower layer of the passivation layer 270. The passivation layer 270 may be formed of a transparent insulator to accomplish a resonance effect.

After the pixel electrode 281 is formed on the passivation layer 270, a pixel defining layer 290 may be formed of an organic material and/or an inorganic material to cover the pixel electrode 281 and the passivation layer 270. An opening may be formed in the pixel defining layer 290 to expose the pixel electrode 281.

An intermediate layer 282 and an opposite electrode 283 may be formed at least on the pixel electrode 281.

Although the pixel electrode 281 may serve as an anode and the opposite electrode 283 may serve as a cathode, polarities of the pixel electrode 281 and the opposite electrode 283 may be reversed.

The pixel electrode 281 and the opposite electrode 283 may be insulated from each another by the intermediate layer 282, and may apply voltages having polarities different from each other to the intermediate layer 282, and light may be emitted by an organic emission layer.

The intermediate layer 282 may include the organic emission layer. In some embodiments, in addition to the organic emission layer, the intermediate layer 282 may further include at least one of a hole injection layer, a hole transport layer, an electron transport layer, and an electron injection layer.

One unit pixel may include a plurality of sub-pixels and the plurality of sub-pixels may emit light of various colors. For example, the plurality of sub-pixels may include the sub-pixels respectively emitting light of red, green, and blue, or may include sub-pixels (not denoted) respectively emitting light of red, green, blue, and white.

The thin film encapsulation layer E may include a plurality of inorganic layers, or may include an inorganic layer and an organic layer.

The organic layer of the thin film encapsulation layer E may be formed of a polymer. The organic layer may be a single layer or a layer stack, and may be formed of one of polyethylene terephthalate, PI, polycarbonate, epoxy, polyethylene, and polyacrylate. For example, the organic layer of the thin film encapsulation layer E may be formed of polyacrylate, and in detail, may include a polymerized monomer composition including a diacrylate-based monomer and a triacrylate-based monomer. The monomer composition may further include a monoacrylate-based monomer. In an embodiment, the monomer composition may further include a photoinitiator such as trimethylbenzoyl diphenylphosphine oxide (TPO).

The inorganic layer of the thin film encapsulation layer E may be a single layer or a layer stack including a metal oxide or a metal nitride. For example, the inorganic layer may include one of $SiN_x$, aluminum oxide ($Al_2O_3$), silicon dioxide ($SiO_2$), and titanium dioxide ($TiO_2$).

The uppermost layer of the thin film encapsulation layer E exposed to the outside may be formed of an inorganic layer to prevent moisture from permeating into the OLED 280.

The thin film encapsulation layer E may include at least one sandwich structure in which at least one organic layer is disposed between at least two inorganic layers. In some embodiments, the thin film encapsulation layer E may include at least one sandwich structure in which at least one inorganic layer is disposed between at least two organic layers. In other embodiments, the thin film encapsulation layer E may include a sandwich structure in which at least one organic layer is disposed between at least two inorganic layers and another sandwich structure in which at least one inorganic layer is disposed between at least two organic layers.

The thin film encapsulation layer E may include a first inorganic layer, a first organic layer, and a second inorganic layer sequentially disposed from the top of the OLED 280.

In some embodiments, the thin film encapsulation layer E may include a first inorganic layer, a first organic layer, a second inorganic layer, a second organic layer, and a third inorganic layer sequentially disposed from the top of the OLED 280.

In other embodiments, the thin film encapsulation layer E may include a first inorganic layer, a first organic layer, a second inorganic layer, a second organic layer, a third inorganic layer, a third organic layer, and a fourth inorganic layer sequentially disposed from the top of the OLED 280.

Between the OLED 280 and the first inorganic layer, a halogenated metal layer including lithium fluoride (LiF) may be additionally included. The halogenated metal layer may prevent the OLED 280 from being damaged when the first inorganic layer is formed by sputtering.

An area of the first organic layer may be less than that of the second inorganic layer, and an area of the second organic layer may be less than that of the third inorganic layer.

The second member P may include the polarizing film described above. The polarizing film may be identical or similar to a polarizing film used in the field of displays, and a detailed description thereof will be omitted.

In the display device 200 manufactured as described above, no bubble may be are formed between the first member R and the second member P, and the display device 200 may have a sharp picture.

Figure 5:
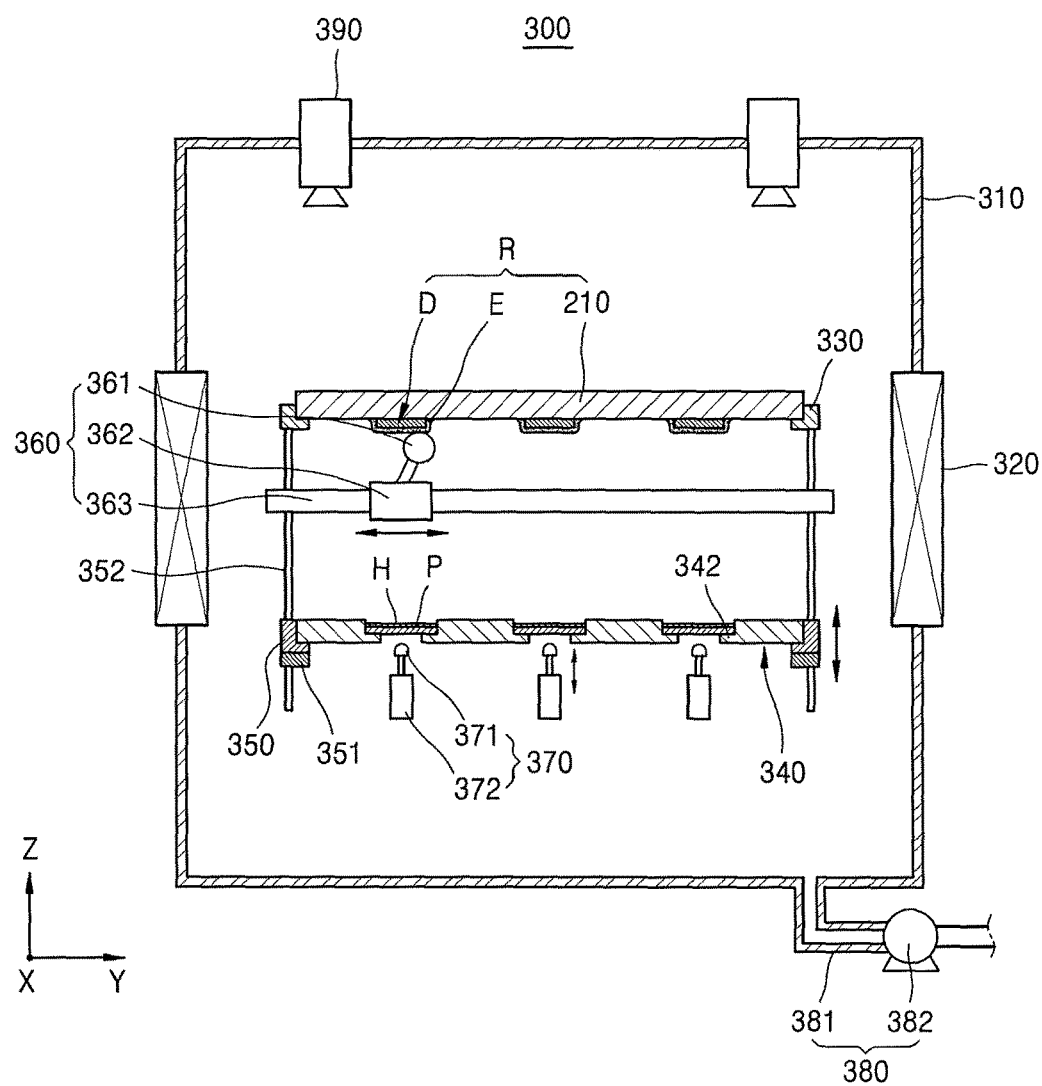
FIG. 5 illustrates a cross-sectional view of an apparatus for manufacturing a display device, according to another embodiment.

FIG. 5 illustrates a cross-sectional view of an apparatus 300 for manufacturing a display device, according to another embodiment. Referring to FIG. 5, the apparatus 300 for manufacturing a display device may include a chamber 310, a first holder 330, a pre-alignment unit 340, a second holder 350, a first linear driving unit 352, an attaching roller unit 360, a pin unit 370, an alignment unit 351, a filming unit 390, and a pressure adjusting unit 380.

The chamber 310, the first holder 330, the pre-alignment unit 340, the second holder 350, the first linear driving unit 352, the pin unit 370, the alignment unit 351, the filming unit 390, and the pressure adjusting unit 380 may be identical or similar to the chamber 110, the first holder 130, the pre-alignment unit 140, the second holder 150, the first linear driving unit 152, the pin unit 170, the alignment unit 151, the filming unit 190, and the pressure adjusting unit 180 which are described in FIGS. 1 through 4, and detailed descriptions thereof will be omitted.

The attaching roller unit 360 may include a roller 361, a third linear driving unit 362, and a force applying unit 363. The roller 361 may be provided in the third linear driving unit 362 to be rotatable, may roll across the second member P, e.g., in the x-y plane, and may attach a first member R and a second member P. The roller 361 may be connected to the third linear driving unit 362 such that the roller 361 is positioned at an angle with respect to a surface of the first member R. The force applying unit 363 may be disposed between the roller 361 and the third linear driving unit 362, may apply force to the roller 361 toward the first member R, and the roller 361 may attach entire surfaces of the first member R and the second member P by applying pressure to the second member P.

The apparatus 300 for manufacturing a display device may operate the same as described above or in a similar manner.

After the first member R and the second member P are prepared, the first member R may be inserted into the chamber 310 and may be mounted in the first holder 330. The second member P may be mounted in a second member mounting groove 342 of the pre-alignment unit 340, the pre-alignment unit 340 may be inserted into the chamber 310, and the pre-alignment unit 340 may be mounted in the second holder 350. Before the chamber 310 may be opened via a gate valve 320, the internal pressure of the chamber 310 may be adjusted to be equal to atmospheric pressure.

When the mounting of the first member R to the pre-alignment unit 340 is complete, a pump 382 may be activated to discharge gas from the chamber 310 to the outside through a connection pipe 381. The chamber 310 may be kept in vacuum.

Based on images captured by the filming unit 390, a controller (not shown) may align positions of the first member R and the pre-alignment unit 340. As described above, the alignment may be made as the controller (not shown) moves the pre-alignment unit 340 via the alignment unit 351.

Once the above process is complete, the first linear driving unit 352 may move the second holder 350 linearly such that the pre-alignment unit 340 is adjacent to the first member R. Next, the second linear driving unit 372 may move a head portion 371 linearly such that the head portion 371 makes contact with the second member P. The head portion 371 may apply force to various positions of the second member P. In some embodiments, the head portion 371 may apply pressure to one end of the second member P in a width or length direction of the second member P, e.g., along the x-y plane. One of the two ends of the second member P may be attached to the first member R, and the other of the two ends of the second member P may be apart from the first member R. In other embodiments, the head portion 371 may attach a central portion of the second member P to the first member R.

Once attaching the first member R and the second member P is complete, the second linear driving unit 372 may move the head portion 371 linearly, e.g., along the z-direction, such that the head portion 371 is separated from the second member P.

Next, the third linear driving unit 362 may attach the first member R and the second member P completely by moving the roller 361 linearly in a width or length direction of the first member R. In the case in which one of the two ends of the second member P is attached to the first member R, the first member R and the second member P may be attached as the roller moves from a portion in which the first member R and the second member P are attached to a portion in which the first member R and the second member P are not attached. In the case in which the central portion of the second member P is attached to the first member R, the first member R and the second member P may be attached, for example, by the roller 361 having a greater radius than a curve formed by the drooping of the second member P.

During the above operation, the force applying unit 363 may apply force to the roller 361 toward the first member R. The pump 382 may suck air in the connection pipe 381, and a vacuum state may be maintained inside the chamber 310.

According to the apparatus 300 for manufacturing a display device and the method of manufacturing a display device, bubbles that may occur when the first member R and the second member P are attached may be effectively removed, and defects in the product may be reduced. A process of pre-aligning the second member P may be omitted by using the pre-alignment unit 340, and a structure of an apparatus for manufacturing a display device may be simplified and the production process may be streamlined.

Figure 6:
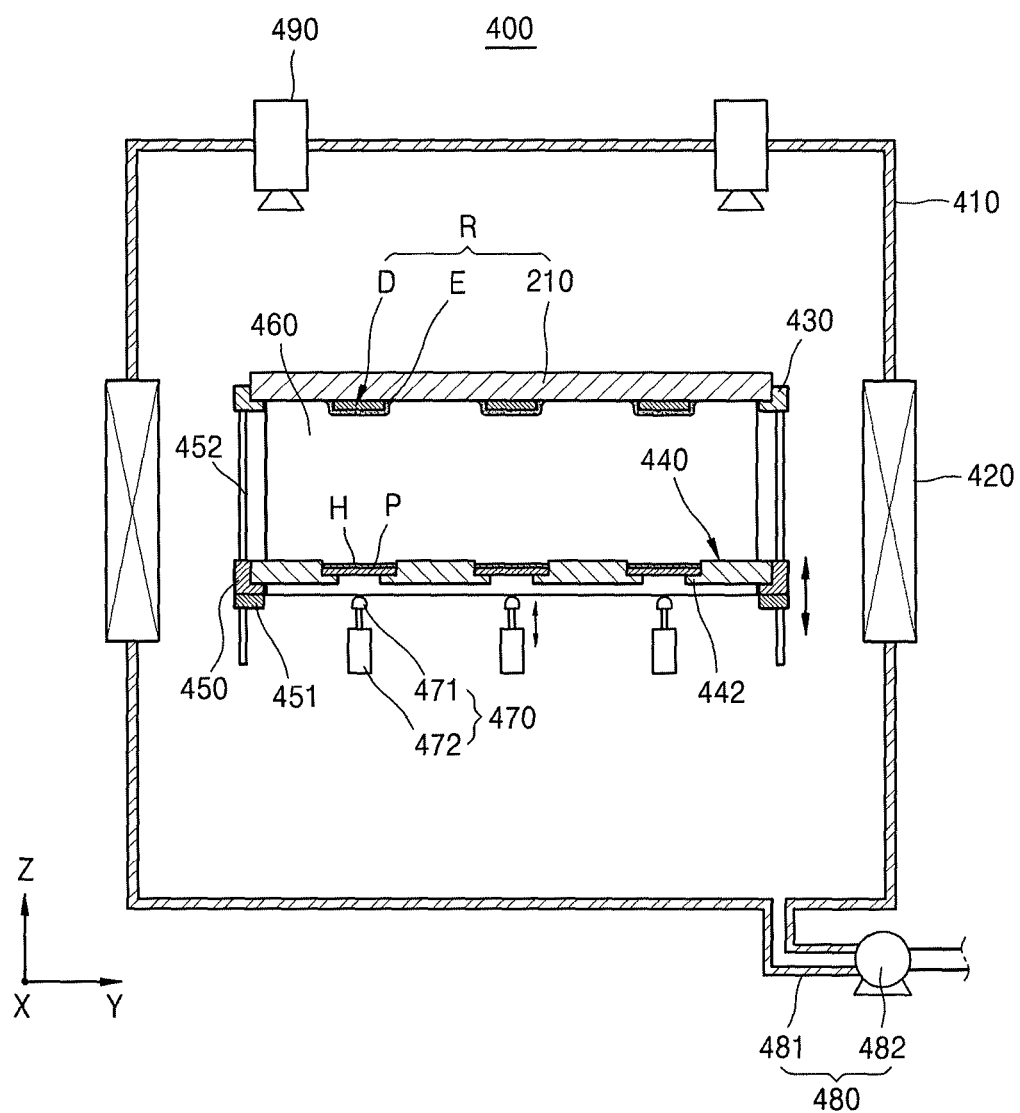
FIG. 6 illustrates a cross-sectional view of an apparatus for manufacturing a display device, according to another embodiment.

FIG. 6 illustrates a cross-sectional view of an apparatus 400 for manufacturing a display device, according to another embodiment. Referring to FIG. 6, the apparatus 400 for manufacturing a display device may include a chamber 410, a first holder 430, a pre-alignment unit 440, a second holder 450, a first linear driving unit 452, a pressing unit 460, a pin unit 470, an alignment unit 451, a filming unit 490, and a pressure adjusting unit 480.

The chamber 410, the first holder 430, the pre-alignment unit 440, the second holder 450, the first linear driving unit 452, the pin unit 470, the alignment unit 451, the filming unit 490, and the pressure adjusting unit 480 may be identical or similar to the chamber 110, the first holder 130, the pre-alignment unit 140, the second holder 150, the first linear driving unit 152, the pin unit 170, the alignment unit 151, the filming unit 190, and the pressure adjusting unit 180 which are described in FIGS. 1 through 4, and detailed descriptions thereof will be omitted.

When a second member P is attached to a first member R, the pressing unit 460 may apply force to the second member P, and the second member P may be attached to the first member R. The pressing unit 460 may include a jig (not shown), and a third linear driving unit (not shown) for applying force to the jig (not shown).

The jig may be provided at various positions. For example, the jig may be disposed in parallel with the second holder 450. The first holder 430 may move linearly and move onto the jig after a portion of the second member P is attached to the first member R. In some embodiments, the jig may be provided at a side of the first holder 430 to be rotatable. After a portion of the second member P is attached to the first member R, the jig may apply pressure to the second member P by rotating. Hereinafter, the case in which the jig may be provided at the first holder 430 to be rotatable will be mainly described in detail for convenience of explanation.

The apparatus 400 for manufacturing a display device may operate the same as described above or in a similar manner.

After the first member R and the second member P are prepared, the first member R may be inserted into the chamber 410 and may be mounted in the first holder 430. The second member P may be mounted in a second member mounting groove 442 of the pre-alignment unit 440, the pre-alignment unit 440 may be inserted into the chamber 410, and the pre-alignment unit 440 may be mounted in the second holder 450. Before the chamber 410 may be opened via a gate valve 420, the internal pressure of the chamber 410 may be adjusted to be equal to atmospheric pressure.

When the mounting of the first member R to the pre-alignment unit 440 is complete, a pump 482 may be activated to discharge gas from the chamber 410 to the outside through a connection pipe 481. The chamber 410 may be kept in vacuum.

Based on images captured by the filming unit 490, a controller (not shown) may align positions of the first member R and the pre-alignment unit 440. As described above, the alignment may be made as the controller (not shown) moves the pre-alignment unit 440 via the alignment unit 451.

Once the above process is complete, the first linear driving unit 452 may move the second holder 450 linearly such that the pre-alignment unit 440 is adjacent to the first member R. Next, the second linear driving unit 472 may move a head portion 471 linearly such that the head portion 471 makes contact with the second member P.

Once attaching the first member R and the second member P is complete, the second linear driving unit 472 may move the head portion 471 linearly such that the head portion 471 is separated from the second member P.

Next, the third linear driving unit (not shown) may attach the second member P to the first member R by rotating the jig. Force may be applied via the jig to the second member P in a direction from one end of the second member P to the other end thereof, and bubbles formed between the first member R and the second member P may be discharged to the outside.

During the above operation, the pump 482 may suck air in the connection pipe 481, and a vacuum state may be maintained inside the chamber 410.

According to the apparatus 400 for manufacturing a display device and the method of manufacturing a display device, bubbles that may occur when the first member R and the second member P are attached may be effectively removed, and defects in the product may be reduced. A process of pre-aligning the second member P may be omitted by using the pre-alignment unit 440, and a structure of an apparatus for manufacturing a display device may be simplified and the production process may be streamlined.

By way of summation and review, a mobile electronic apparatus may include a display device to support various functions, for example, to provide a user with visual information such as images and pictures. As other components for driving the display device become smaller, the size of the display device with respect to the electronic device may increase. Structures may allow a display device in a flat state to be bent.

Various members may be used for the display device, and the members may be manufactured to adhere to each other. An apparatus for manufacturing the display device used in the bonding process may affect performance and manufacturing yield of the product.

As described above, according to the one or more of the above exemplary embodiments, an apparatus for manufacturing a display device and a method of manufacturing the display device may increase manufacturing efficiency.

Example embodiments have been disclosed herein, and although specific terms are employed, they are used and are to be interpreted in a generic and descriptive sense only and not for purpose of limitation. In some instances, as would be apparent to one of skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A method of manufacturing a display device, the method comprising:
    inserting a second member into at least one second member mounting groove in a pre-alignment unit;
    moving the pre-alignment unit linearly in a first direction such that the pre-alignment unit comes into contact with a first member mounted in a first holder in a chamber, the first member including a substrate;
    attaching a portion of the second member to the first member by activating a pin unit, activating the pin unit including moving a head portion of the pin unit from a position spaced apart from the at least one second member mounting groove into the at least one second member mounting groove, such that a contact area of the second member to the first member is a dot or a line; and
    attaching an entire surface of the first member and an entire surface of the second member to each other,
    wherein attaching the portion of the second member further includes moving the pre-alignment unit linearly in the first direction away from the first member as the pin unit is still active and the head portion of the pin unit extends through the pre-alignment unit and is closer to the substrate than a surface of the pre-alignment unit facing the first holder.

2. The method as claimed in claim 1, wherein attaching the entire surface of the first member and the entire surface of the second member to each other includes adjusting internal pressure of the chamber from a vacuum state to atmospheric pressure.

3. The method as claimed in claim 1, wherein attaching the entire surface of the first member and the entire surface of the second member to each other includes rolling a roller across the second member.

4. The method as claimed in claim 1, wherein attaching the entire surface of the first member and the entire surface of the second member to each other includes applying pressure to the second member.

5. The method as claimed in claim 1, further comprising aligning the pre-alignment unit and the first member in a direction orthogonal to the first direction before moving the pre-alignment unit linearly along the first direction.

6. The method as claimed in claim 1, wherein attaching the portion of the second member to the first member and attaching the entire surface of the first member to the entire surface of the second member are performed in a vacuum state.

* * * * *